United States Patent [19]
Levy

[11] Patent Number: 5,414,372
[45] Date of Patent: May 9, 1995

[54] REUSABLE TEST APPARATUS FOR INTEGRATED CIRCUIT CHIPS

[75] Inventor: Paul S. Levy, Chandler, Ariz.

[73] Assignee: VLSI Technology, Inc., San Jose, Calif.

[21] Appl. No.: 218,089

[22] Filed: Mar. 25, 1994

Related U.S. Application Data

[63] Continuation-in-part of Ser. No. 82,117, Jun. 23, 1993.

[51] Int. Cl.⁶ .................... G01R 31/02; G01R 1/073
[52] U.S. Cl. .................................... 324/765; 324/751
[58] Field of Search ........... 324/158 R, 158 F, 158 P, 324/72.5, 158.1, 73.1, 765, 751; 439/68, 69, 70, 71, 330, 331; 437/8; 257/40, 48

[56] References Cited

U.S. PATENT DOCUMENTS

| | | | |
|---|---|---|---|
| 4,554,505 | 11/1985 | Zachry | 324/158 F |
| 4,701,703 | 10/1987 | Malloy | 324/158 F |
| 4,766,371 | 8/1988 | Moriya | 324/158 F |
| 4,899,107 | 2/1990 | Corbett et al. | 324/158 R |
| 5,086,269 | 2/1992 | Nobi | 324/158 F |
| 5,123,850 | 6/1992 | Elder et al. | 439/67 |
| 5,237,269 | 8/1993 | Aimi et al. | 324/158 R |
| 5,302,891 | 4/1994 | Wood et al. | 324/158 F |

Primary Examiner—Vinh Nguyen
Attorney, Agent, or Firm—LaValle D. Ptak

[57] ABSTRACT

A reusable carrier is employed to permit burn-in and testing of loose die for integrated chip modules. This is accomplished by providing a carrier and an insert, both made of electrically insulating material in a generally rectangular form, with upper and lower co-planar surfaces. The upper surface of the carrier has a cavity in it, which is dimensioned to hold the insert. The insert, in turn, has an aperture in it dimensioned to hold the die under test. The die is set into the aperture of the insert which is placed in the cavity, and a bumped flex circuit is placed over the insert/die/carrier assembly. Alignment pins register the flex circuit with the carrier. The upper surface of the carrier has a number of contact pads on it; and connections are made between bonding pad contacts on the face of the die and these contact pads in accordance with the flex circuit interconnections. A rubber-backed pressure plate is placed over the flex circuit, and spring clips provide the necessary pressure to maintain the electrical contacts between the bonding pads and the contact pads. The entire assembly is treated as a single package for burn-in and testing of the die.

14 Claims, 3 Drawing Sheets

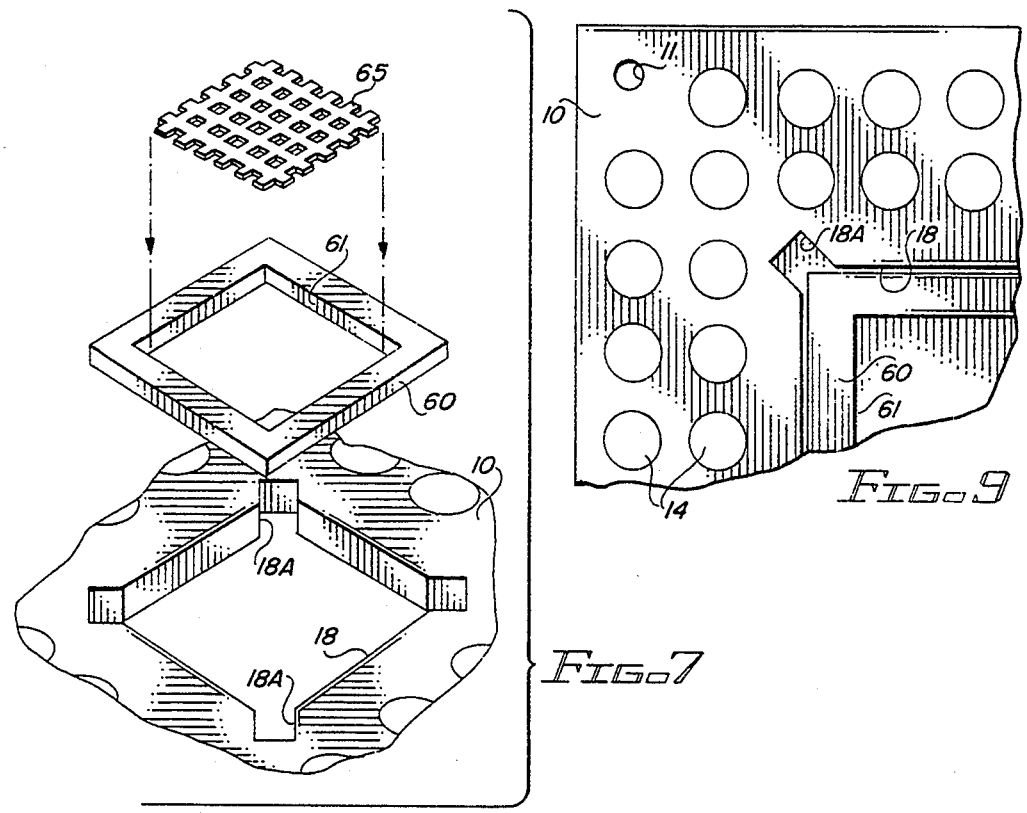
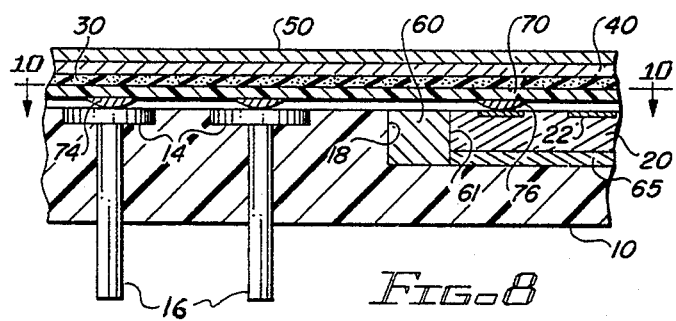
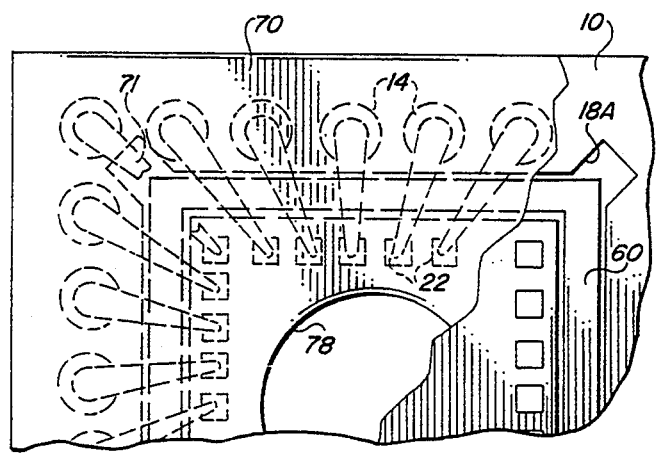

REUSABLE TEST APPARATUS FOR INTEGRATED CIRCUIT CHIPS

RELATED APPLICATION

This application is a continuation-in-Part of copending application Ser. No. 08/082,117, filed on Jun. 23, 1993 and assigned to the same assignee as this application.

BACKGROUND

In the manufacture of integrated circuit devices, silicon wafers are processed and separated into individual integrated circuit die. These die then are interconnected in circuit packages to ultimately form integrated circuit chip packages or modules, used in various products such as computers, printers, and other electronic devices. Integrated circuit devices typically are tested after manufacture and assembly into the integrated circuit modules. Considerable manufacturing expense, however, already has occurred by the time the finished product is made. If, during testing and burn-in of the finished integrated circuit package, a failure is discovered on the die which constitutes the heart of the integrated circuit module, the entire module generally must be scrapped. If the failure of the module is the result of an electrical failure in the die itself, the extra expense required in the circuit interconnections and packaging, which are necessary to manufacture a completed integrated circuit module, could be avoided if the defects in the integrated circuit die could be detected prior to such additional manufacturing steps.

Because integrated circuit chip die are small and relatively fragile, effecting burn-in operation of the die prior to assembly into an integrated circuit module, has not been feasible in the past. The problem is compounded when a completed integrated circuit chip module is made up of multiple die, any of which inherently may have defects which typically are not detected until the completed module has been manufactured.

It is desirable to provide apparatus and a method for effecting burn-in and testing of integrated circuit die while they still are loose, that is before such die are fabricated into an integrated circuit chip module.

SUMMARY OF THE INVENTION

It is an object of this invention to provide an improved integrated circuit test apparatus.

It is another object of this invention to provide an improved universal integrated circuit test apparatus for testing loose integrated circuit chip die.

It is an additional object of this invention to provide a reusable test apparatus for burn-in and testing of loose integrated circuit chip die.

It is a further object of this invention to provide a reusable universal test apparatus employing a modular carrier for loose integrated circuit chip die assembled as a single package for burn-in and test of the die.

In accordance with a preferred embodiment of this invention, a reusable test apparatus for integrated circuit chip die comprises a reusable carrier member made of insulating material, which has a cavity in its upper surface dimensioned to conform to the external dimensions of the die to be tested. The die are placed on a thermal pad cusion in the cavity, or in a pre-form insert which is placed in the cavity; so that bonding pad contacts, located on a face of the die, face upward contact pads are located on the carrier around the cavity; and these are interconnected with electrical connector pins, which extend through the carrier to protrude from the lower surface for electrical contact in a test apparatus. A flexible circuit, which has interconnected conductive protrusions on it in accordance with a pattern for testing the particular die placed in the cavity, is placed over the upper surface of the carrier. The flexible circuit then is pressed into contact with the bonding pad contacts on the die and the contact pads on the carrier to make selected circuit interconnections between different ones of the contact pads and the bonding pads on the die. Appropriate burn-in and test operations then are effected by electrical connections made to the pins extending through the lower surface of the carrier.

BRIEF DESCRIPTION OF THE DRAWINGS

FIG. 7 is an exploded perspective view of an alternative form of the embodiment of FIG. 1;

FIG. 8 is an enlarged cross-sectional view of the alternative embodiment of FIG. 7;

FIG. 9 is a top view of the sub-assembly of FIG. 7; and

FIG. 10 is a diagrammatic top view illustrating various circuit interconnections and other features of the embodiment of FIGS. 7 through 9.

DETAILED DESCRIPTION

Figure 1:
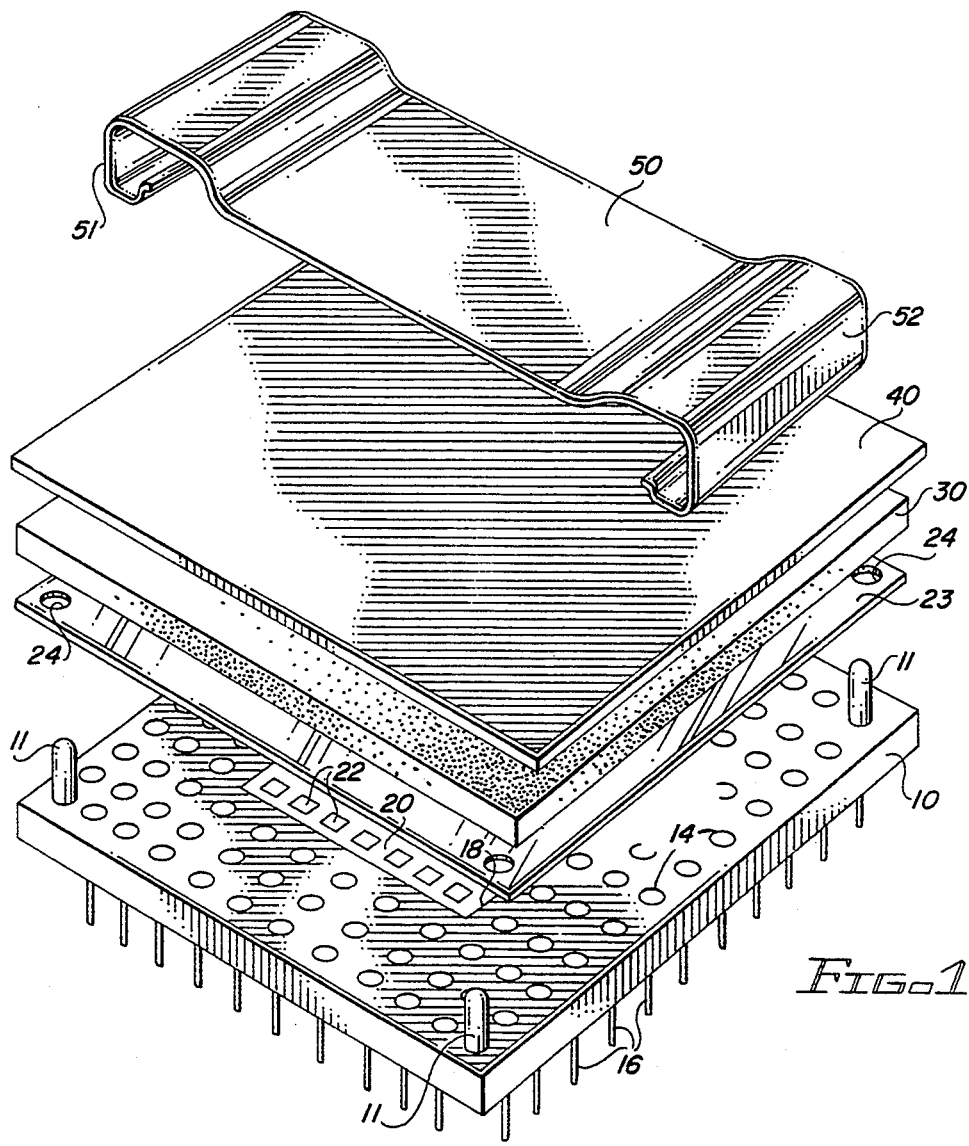
FIG. 1 is an exploded perspective view of a preferred embodiment of the invention.

Reference now should be made to the drawing, in which the same reference numbers are used throughout the different figures to designate the same components.

Figure 2:
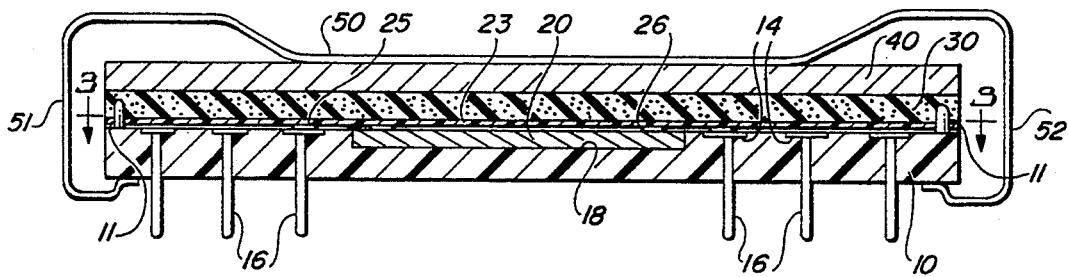
FIG. 2 is a cross-sectional view of the embodiment shown in FIG. 1.

The reusable test apparatus is shown most clearly in FIGS. 1 and 2. The apparatus comprises a reusable carrier 10, which is a PGA type integrated circuit carrier made of plastic or ceramic, as desired. The carrier 10 is rigid, and is made of material which is strong enough to resist bending deformation in planes perpendicular to its thickness. As is illustrated in FIGS. 1 and 2, the upper and lower surfaces of the carrier 10 are co-planar; and the carrier has a generally rectangular configuration.

Figure 4:
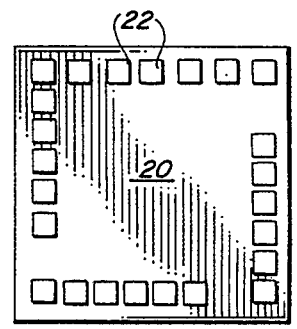
FIG. 4 is a top view of a device to be tested in the apparatus of FIGS. 1 and 2.

The central area of the upper surface of the carrier 10 has a rectangular recess or cavity 18 located in it. The depth of this recess 18 is selected to be equal to the thickness of an integrated circuit chip die 20 (shown most clearly in FIGS. 2 and 4). The length and width of the cavity 18 are chosen to be slightly larger than the corresponding dimensions of the die 20. Typically, these dimensions exceed the corresponding dimensions of the die 20 by approximately one mil. This permits the die 20 to be placed into the cavity 18 and seated in the bottom of the cavity easily; but the dimensions are close enough to maintain accurate alignment of the die in the cavity, so that its position with respect to the other portions of the reusable carrier base 10 are maintained.

As shown most clearly in FIGS. 1 and 2, the carrier 10 has several rows (shown as three rows in FIGS. 1 and 2 as an example) of evenly spaced contact pads 14 located on its upper surface. These contact pads 14 may be made of any suitable electrically conductive material, including gold-plated surfaces, if desired. The pads 14 each are connected to the top of a downwardly extending connector pin 16, which extends perpendicularly through the carrier 10 to protrude from the lower surface, as shown most clearly in FIGS. 1 and 2. The pins 16 then are available for electrical connection to the load board of a suitable integrated circuit test apparatus.

Figure 3:
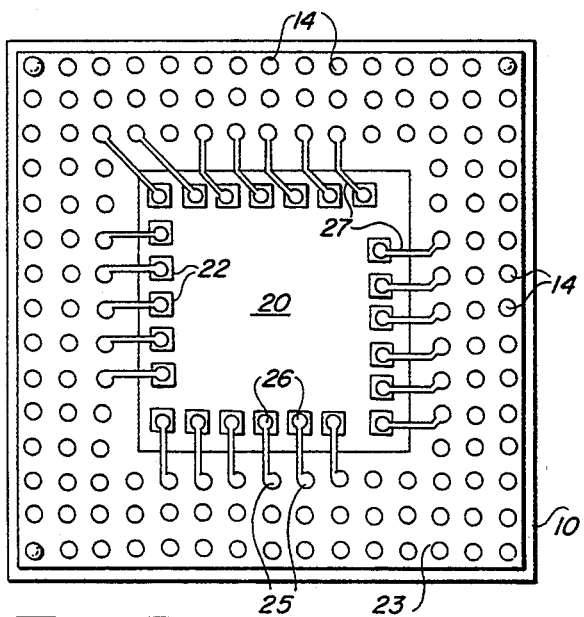
FIG. 3 is a diagrammatic top view illustrating various circuit interconnections made between some of the parts in the embodiment of FIGS. 1 and 2.
Figure 5:
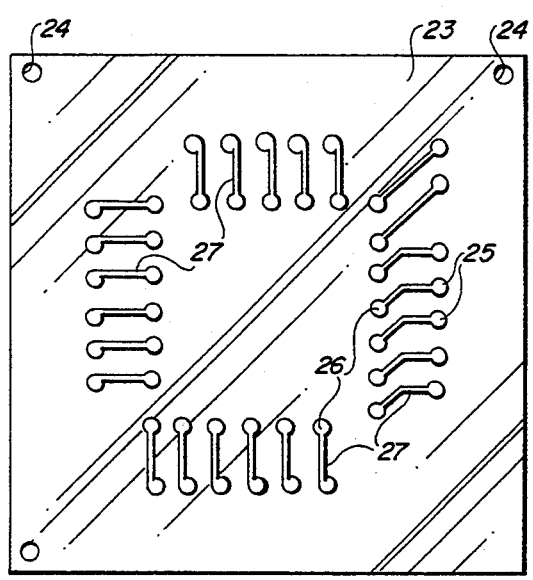
FIG. 5 is a bottom view of a portion of the apparatus shown in FIGS. 1 and 2.
Figure 6:
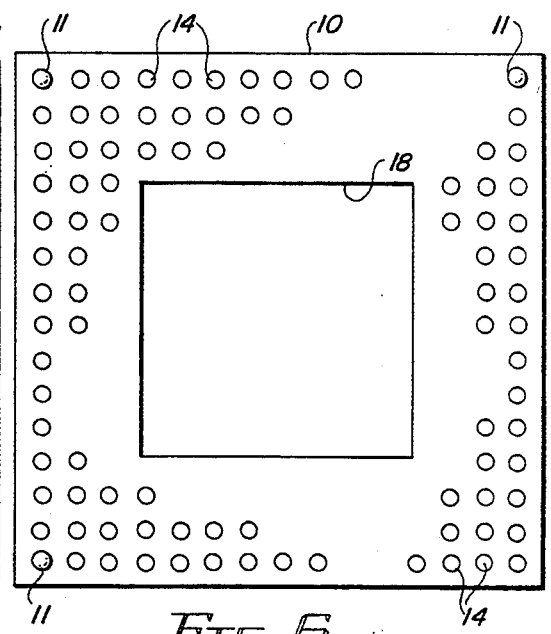
FIG. 6 is a top view of a portion of the embodiment shown in FIGS. 1 and 2.

When testing of an integrated circuit chip die 20 is to be made, a die 20 first is placed into the cavity as shown in FIGS. 1 and 2, with the surface having the bonding pads 22 of the die facing upwardly, as illustrated in FIGS. 1, 2, 3 and 4. A flex circuit sheet 23 next is placed over the carrier 10 and chip 20. Locator or alignment pins 11 extend upwardly from three of the four corners of the carrier 10, and these pins are inserted through alignment holes 24, located in the corresponding three corners of the sheet 23. The flex circuit 23 typically is a flexible printed integrated circuit made of Mylar/or other suitable material, with a pre-established wiring pattern printed on it. The wiring pattern 27 is shown in FIGS. 3 and 5. FIG. 5 is a view of the lower surface of the sheet 23, and illustrates interconnections between bumps or conductive protrusions in two groups, 25 and 26, as shown most clearly in FIGS. 3 and 5. The protrusions of the group 25 are selected to overlie selected ones of the contact pads 14 on the surface of the carrier 10. These selected pads 14 correspond with the locations of the pins 16 protruding beneath the carrier for operation of a test on a corresponding load board (not shown) for the particular die 20, which is selected to undergo burn-in and testing. Similarly, the protrusions or bumps 26, illustrated in FIGS. 3 and 5, are selected to overlie the bonding pads 22 of the die 20 which is to undergo test. The printed circuit connectors 27 then interconnect the selected ones of the bonding pads 22 on the die 20 with the contact pads 14 on the surface of the carrier 10, which will effect the desired interconnections with the test equipment connected through the load board to the corresponding pins 16 protruding from the lower surface of the carrier 10.

The portion of the system which has been described thus far is all that is required for effecting the desired electrical interconnections for testing the die 10. To ensure, however, that good electrical contact is made and maintained throughout the test operation, the flex sheet 23 is pressed downwardly to cause an effective engagement of the bumps 25 and 26 with the corresponding contact pads 14 and bonding pads 22 described previously. This is accomplished by the provision of a rectangular rubber insulating sheet and a metal pressure plate 40, sandwiched in the order named, on top of the flex circuit sheet 23. The pressure plate 40 is pressed downwardly onto the top of the rubber sheet to distribute pressure evenly over the surface of the flex circuit 23 by means of a spring clip 50.

The clip 50 has a central portion, which presses downwardly on the sheet 40. A pair of side portions 51 and 52 of the clip 50 extend over and around the edge of the carrier 10 to pull the spring clip 50 downwardly into engagement with the top of the sheet 40. This is illustrated most clearly in FIG. 2.

Once the desired test has been run on the die, the device is disassembled by removing the spring clip 50, the pressure plate 40, the rubber pad 30, and the flex circuit 23. The die 20 then can be removed and another die placed in the cavity 18 for a subsequent test. The device then is reassembled, as shown in FIGS. 1 and 2, and the subsequent test is run.

Different die 20, having either a different arrangement of bonding pads 22 and/or requiring different tests to be run may be tested as described above. In each case, each different die 20 still is placed in the cavity 18 of the universal reusable carrier 10. A flex circuit 23, however, having a different pattern of interconnections between protrusions 25 overlying selected ones of the contact pads 14 and the protrusions 26 overlying bonding pads 22 on the die 20, is employed for each different die 20. Consequently, the active pins 16 extending through the bottom of the carrier 10 may differ from those which have been illustrated in the drawings accompanying the above description. The result is that the reusable carrier 10 may be used to test different integrated circuit chip die without any modification whatsoever in the carrier. The different die are effectively interconnected for testing by means of selected different flex circuit patterns on the flexible circuits 23, which are used with the apparatus.

In order to reduce the need for an inventory of a large number of different reusable carriers to accommodate all of the different external dimensions of integrated circuit chip die 20, the alternative embodiment, illustrated in FIGS. 7 through 10, is provided. Only those portions of the variation which differ from the embodiment of FIGS. 1 through 6 are illustrated in FIGS. 7 through 10, in order to avoid unnecessary cluttering of the drawings. This variation employs a rectangular recess or cavity 18 in the carrier 10, which is formed in the same way as the recess described above in conjunction with FIGS. 1 through 6. The recess 18 of the embodiment shown in FIG. 7, however, is selected to have the largest length and width dimensions for any die 20 which is to be tested in the system using the carrier 10.

Whenever die 10 having external lengths and widths which are less than the maximum length and width of the cavity 18 are to be tested, a pre-form insert 60 is provided. The insert 60 is made of electrically insulated plastic or ceramic material. The insert 60 resembles a rectangular picture frame with an internal aperture 61 in it. The external length and width of the insert 60 are such that it fits snugly into the recess 18 of the carrier 10.

As illustrated clearly in FIGS. 7, 9 and 10, the carrier recess 18 has corner relief cutouts 18A formed in it; so that when the pre-form 60 is in place, as shown in FIGS. 9 and 10, it readily may be removed by prying up on the corner of the pre-form 60 in one of the relief areas 18A. In all other respects, the carrier 10 is the same as the carrier 10 shown and described above in FIGS. 1, 2 and 6. The internal length and width of the pre-form or aperture sub-recess 61 are slightly larger than the corresponding dimensions of a die 20 undergoing test when the the die 20 has length and width dimensions less than the length and width dimensions of the main recess 18 in the carrier 10.

It is important for the bottom of the cavity 18 to be very flat, to minimize physical die stress. A thin film thermal pad 65, cut to the size of the die (and therefore, conforming to the interior dimensions of the pre-form insert 61), is made out of screen mesh polymer material. This thermal pad is used as a cushion between the die 20 and the bottom of the cavity 18. The thermal pad.65 prevents die cracking from an uneven cavity bottom. The slight resiliency of the thermal pad 65 cushions irregularities or unevenness in the bottom of the cavity 18, to substantially reduce the incidence of cracked die 20 in the use of the carrier 10. When the thermal pad 65 is used, the depth of the cavity 18 is made equal to the thickness of the die 20 and the pad 65.

The pre-form 60 is used to control registration of the die 20 to the carrier 10, as described above. For different gate array designs, a set of pre-form inserts 60 is molded to allow complete families of-die to fit into a smaller family of die carriers 10, thereby substantially reducing the necessity for a large inventory of different die carriers 10.

The operation and use of the embodiment shown in FIGS. 1 through 10 is substantially the same as the operation and use of the embodiment described above in conjunction with FIGS. 1 through 6. The first step is to select the appropriate pre-form insert 60 to be placed into the cavity 18 of the die carrier 10, The thermal pad 65 is made slightly tacky on one side, in order to stick to the bottom of the cavity 18. The sawed die 20 then is placed into the carrier, inside the pre-form, on top of the thermal pad cushion 65.

Next, a polyamide flex circuit 70, which has been laid out with flexible circuit connectors 71 to match the die pad pattern and that of the die carrier contact pattern, is placed on the top of the carrier 10, using the guide pins 11 for registration in the same manner as the alignment of the flex circuit sheet 23, mentioned above in conjunction with the embodiment of FIGS. 1 through 6.

Since the size or tolerances of the die 20 can vary, a hole 78 in the center of the flex circuit 70-allows physical access to align the die 20 to the contact pattern on the flex circuit 70. The height of the die also may be varied, due to the flexibility of the polyamide flex circuit 70. Gold bumps 74 and 76 are integrated onto the ends of the flexible circuit connectors 71 to form the contacts between the carrier pads 14 and the die bonding pads 22, respectively.

As with the embodiment of FIGS. 1 through 6, once the flex circuit 70 has been applied, the rectangular rubber insulating sheet 30 and metal pressure plate 40 are sandwiched, in the order named, on top of the polyamide flex circuit 70. The pressure plate 40 is pressed downwardly onto the top of the rubber sheet 30 to distribute pressure evenly over the surface of the flex circuit 70 by means of the spring clip 50. Once the device has been assembled, the necessary test of the die 20 then is run in a conventional manner.

The pre-form insert cavity 61 of the insert 61 is built to allow side tolerance of 2.0 mils space between the die 20 and the inside walls of the pre-form 60 to allow for saw variation of the die 20. The pre-form insert 60 also may have a beveled interior edge along the top to facilitate die loading.

It also should be noted that the polyamide flex circuit 70 uses standard PCB design techniques for layout. The contact bumps 74 and 76 preferably are-gold plated to prevent oxidation, and to ensure low resistance contact. The diameter of the bumps 74 and 76 is 2 mils or less; so that the bumps 76, in particular, fall into the passivation window of the die pad 22. Since the flex circuit 70 is somewhat transparent, optical alignment of the die 20 can be made, if needed, to assure alignment between the die pads 22 and the flex circuit bumps 76. The fabrication of the flex circuit is the same technology currently used in TAB packaging, and is bumped at both ends, as described above.

A significant advantage of the apparatus which has been described is that it permits burn-in and testing of integrated circuit chip die prior to the manufacture of these die into completed integrated circuit modules. It is particularly desirable to test integrated circuit die, in the fixture described above, prior to incorporating the die into modules when the die are intended to be used for multi-chip modules; so that defective die may be found and scrapped at an early stage, before a much more expensive module has been completed.

The foregoing description of the preferred embodiment of the invention is to be considered as illustrative of the invention, and not as limiting. The materials which have been mentioned may be varied; and the particular relative size and arrangement of parts, which have been illustrated, also may be varied as required. Other changes and modifications will occur to those skilled in the art, without departing from the true scope of the invention as defined in the appended claims.

I claim:

1. A reusable test apparatus for integrated circuit chip die, wherein said chip die have a first predetermined thickness, first predetermined width and a first predetermined length, with bonding pad contacts located on one face thereof, said test apparatus including in combination:

an insert member having said first predetermined thickness, a second predetermined width greater than said first predetermined width, a second predetermined length greater than said first predetermined length, and having an aperture therethrough of said first predetermined width and said first predetermined length;

a reusable carrier member with upper and lower planar surfaces and having a cavity for receiving said insert member in the upper surface thereof, said cavity having a depth substantially equal to said predetermined thickness of said insert member and having a width and a length slightly greater than said second predetermined width and said second predetermined length, respectively, of said chip die for releasably holding said insert member with said chip die therein, so that said one face of said chip die is located in substantially the same plane as the plane of the upper surface of said reusable carrier member;

a thermal cushion pad placed in the aperture in said insert member under said chip die in the cavity in said carrier member;

an array of contact pads on the upper surface of said carrier member arranged in a predetermined pattern around said cavity;

electrical connector pins connected with said contact pads of said carrier member and protruding from the lower surface of said carrier member; and a flexible, bumped polyamide film circuit member having conductive protrusions thereon electrically interconnected in a predetermined pattern and releasably placed over the upper surface of said reusable carrier such that selected conductive protrusions thereon make electrical contact with selected bonding pad contacts on said integrated circuit chip die and selected contact pads on the upper surface of said reusable carrier.

2. The combination according to claim 1 further including means for aligning said circuit member with said array of contact pads on the upper surface of said reusable carrier member.

3. The combination according to claim 2 wherein said means for aligning comprise pins protruding upwardly from the upper surface of said reusable carrier member and corresponding pin receiving apertures in said circuit member.

4. The combination according to claim 3 further including means for pressing said circuit member downwardly onto the upper surface of said carrier member and said chip die to ensure electrical contact between said conductive protrusions on said circuit member with selected ones of said bonding pad contacts on said chip die and said contact pads on the upper surface of said carrier member.

5. The combination according to claim 4 wherein said means for pressing said circuit member downwardly comprises a pressure plate and a resilient insulating pad, with said resilient pad located between said pressure plate and the upper surface of said carrier member.

6. The combination according to claim 5 further including releasable spring means for pressing said pressure plate downwardly onto said resilient pad to apply pressure to said circuit member.

7. The combination according to claim 6 wherein said spring means comprises a spring clip extending over the surface of said pressure plate and engaging the lower surface of said carrier member.

8. The combination according to claim 7 wherein said connector pins extend through said carrier member from said contact pads to protrude from the lower surface of said carrier member for electrical contact thereto.

9. The combination according to claim 8 wherein said carrier member and said insert member are made of electrically insulating material.

10. The combination according to claim 9 wherein said carrier member and said insert member are made of material selected from the class of ceramic and plastic materials.

11. The combination according to claim 1 further including means for pressing said circuit member downwardly onto the upper surface of said carrier member and said chip die to ensure electrical contact between said conductive protrusions on said circuit member with selected ones of said bonding pad contacts on said chip die and said contact pads on the upper surface of said carrier member.

12. The combination according to claim 11 wherein said means for pressing said circuit member downwardly comprises a pressure plate and a resilient insulating pad, with said resilient pad located between said pressure plate and the upper surface of said carrier member.

13. The combination according to claim 1 wherein said carrier member and said insert member are made of electrically insulating material.

14. The combination according to claim 13 wherein said carrier member is made of material selected from the class of ceramic and plastic materials.

* * * * *